United States Patent [19]

Miskin

[11] 4,390,849
[45] Jun. 28, 1983

[54] AUDIO POWER AMPLIFIER WITH CLASS-D PUSH-PULL OUTPUT STAGE

[75] Inventor: Leslie Miskin, Gundelfingen, Fed. Rep. of Germany

[73] Assignee: ITT Industries, Inc., New York, N.Y.

[21] Appl. No.: 258,490

[22] Filed: Apr. 28, 1981

[30] Foreign Application Priority Data

May 7, 1980 [DE] Fed. Rep. of Germany ....... 3017414

[51] Int. Cl.³ .................. H03F 3/217; H03F 3/38; H03F 3/68
[52] U.S. Cl. ............... 330/251; 330/207 A; 330/10; 330/126
[58] Field of Search ............. 330/10, 126, 251, 207 A

[56] References Cited

U.S. PATENT DOCUMENTS 4,346,349  8/1982  Yokoyama ................. 330/126

Primary Examiner—James B. Mullins
Assistant Examiner—Gene Wan
Attorney, Agent, or Firm—John T. O'Halloran; Peter C. Van Der Sluys

[57] ABSTRACT

An audio power amplifier with class-D push pull output stage is disclosed using a "mixture" of pulse-width modulation and pulse-amplitude modulation and driving the class-D push pull output stage with the resulting combination signal. To do this, the digital output signal of the analog-to-digital converter in the input stage is split up in such a way that only its high-order bits control the pulse-width modulator, while the other low-order bits are changed into the aforementioned pulse-amplitude-modulated signal by means of an analog-to-digital converter.

1 Claim, 3 Drawing Figures

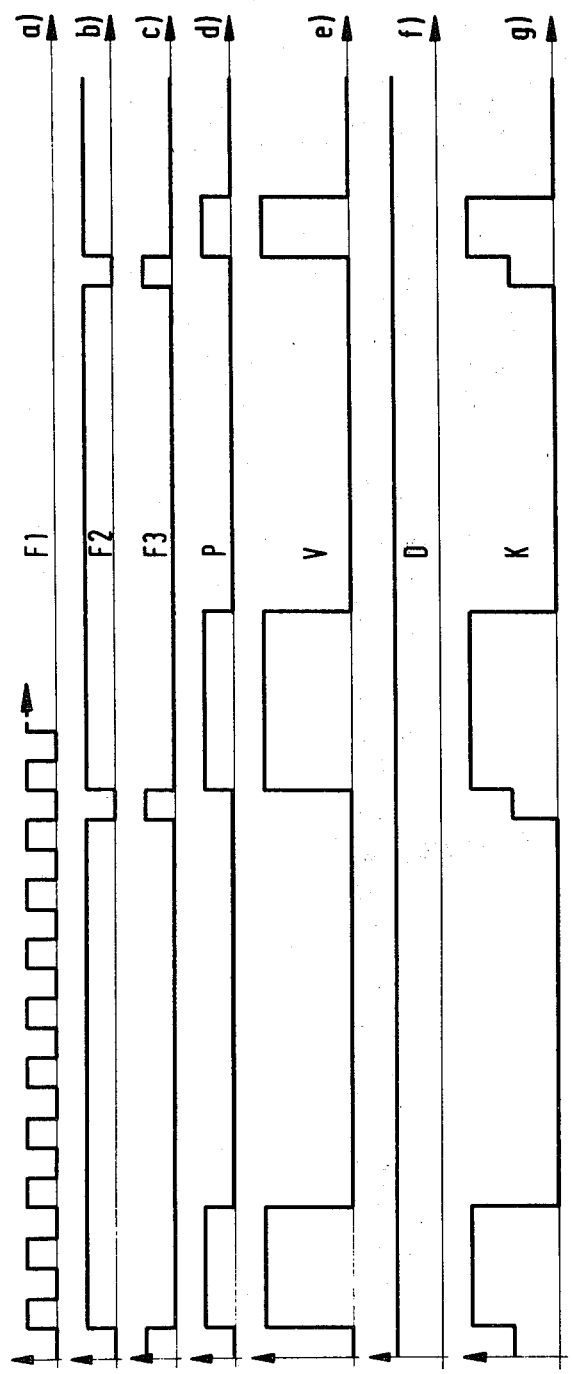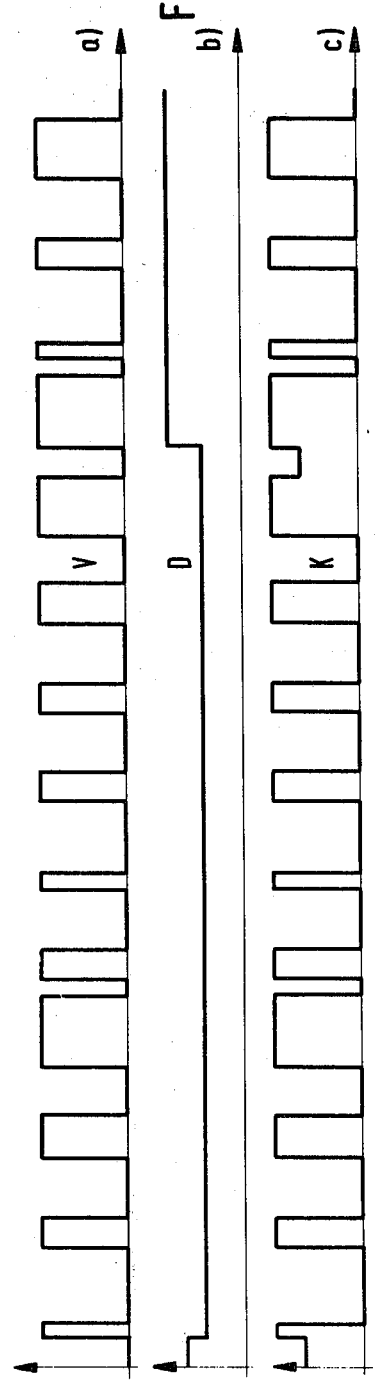

AUDIO POWER AMPLIFIER WITH CLASS-D PUSH-PULL OUTPUT STAGE

Commercially available class-D push-pull output stages are usually operated at a chopper frequency on the order of 500 kHz. If the pulse-width-modulated control signal is to be generated by digital rather than analog techniques, a very high clock frequency is needed. To explain this problem, it is assumed that ten information bits are required for a given resolution, which means that a maximum of about $10^3$ ($2^{10}=1024$) clock pulses may occur per chopper period, i.e., the clock generator must have a frequency on the order of 500 MHz. The chopper frequency of 500 kHz is generally chosen to be of this order because only at such high frequencies will cross-modulation signals of the chopper-frequency output signal to be amplified no longer lie in the frequency band to be amplified.

On the other hand, however, clock frequencies on the order of 500 MHz are so high that a different approach must be found to generate the pulse-width-modulated signal for class-D push-pull output amplifiers by digital techniques. Accordingly, the object of the invention is to provide an audio power amplifier with class-D push-pull output stage wherein the pulse-width-modulated signal is generated using digital techniques, i.e., counters, for example, but whose clock frequency may be considerably below the order of 500 MHz.

This object is attained in an audio power amplifier as set forth in the preamble of claim 1 by the characterizing features. Thus, the principle underlying the invention is to use a "mixture" of pulse-width modulation and pulse-amplitude modulation and to drive the class-D push-pull output stage with the resulting combination signal. To do this, the digital output signal of the analog-to-digital converter in the input stage is split up in such a way that only its high-order bits control the pulse-width modulator, while the other, low-order bits are changed into the aforementioned pulse-amplitude-modulated signal by means of an analog-to-digital converter.

The invention will now be explained in more detail with reference to the accompanying drawings, which:

FIG. 2 shows various waveforms occurring in the arrangement of FIG. 1, and

FIG. 3 shows a few waveforms of FIG. 2 on a compressed time scale.

Figure 1:
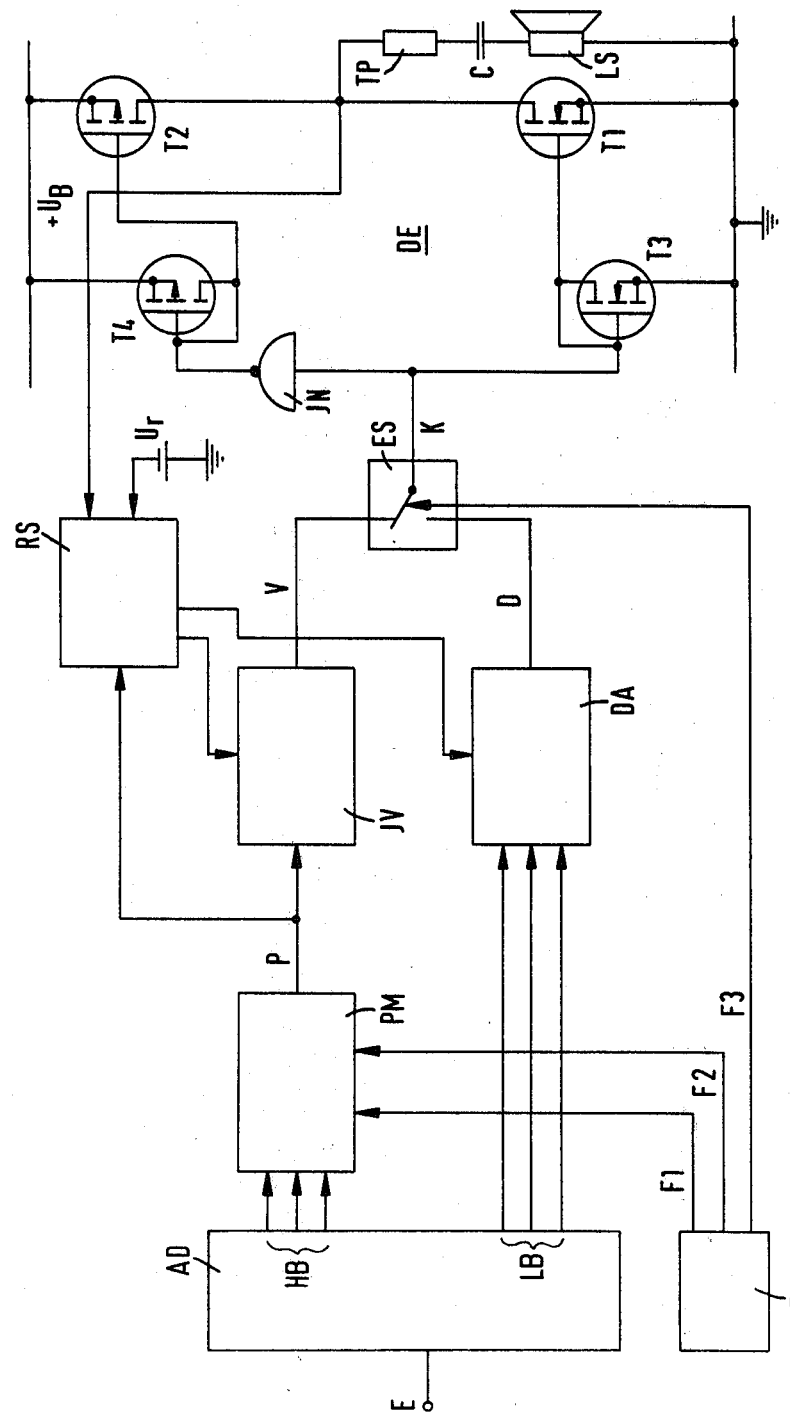
FIG. 1 is a schematic circuit diagram of a preferred embodiment of the invention.

FIG. 1 shows the basic circuit of an embodiment of the invention, partly in the form of a block diagram. The analog audio signal to be amplified is applied at the input E. This input is connected to the input of the analog-to-digital converter AD, which can be of conventional design and provides a binary-coded output signal. In FIG. 1 it is assumed for simplicity that this output signal consists of six bits which are divided into the (three) high-order bits HB and the (three) low-order bits LB for further processing. The low-order bits LB are fed to the digital-to-analog converter DA, which derives a signal therefrom, the pulse-amplitude-modulated part, after the switch ES are the curves D in FIGS. 2f and 3b. The reference voltage of the digital-to-analog converter comes from the gated control stage RS.

The high-order bits HB of the output signal of the analog-to-digital converter AD are applied to the input of the pulse-width modulator PM. This modulator may be a down-counter, for example, which is set by the high-order bits HB and counts the clock pulses F1 from the clock generator TG as long as the clock signal F2 from the clock generator TG is at H level if positive logic is used. The two clock signals F1, F2 are shown in FIGS. 2a and 2b. FIG. 2d shows a few examples of output pulses P of the pulse-width modulator PM. The width of the pulse shown on the left-hand side of FIG. 2d is equal to two periods of the clock signal F1; the pulse shown in the middle is three periods wide, and that shown on the right-hand side is one period wide.

The H level of the clock signal F2 is produced during as many periods of the clock signal F1 as correspond to the maximum pulse width of the pulse-width modulator PM, which width depends on the number of high-order bits HB applied to the input of the pulse-width modulator PM. In the example chosen, i.e., with three high-order bits HB, the H level of the clock signal F2 is thus always eight periods of the clock signal F1 long. It is followed by an L level whose duration is half the period of the clock signal F1.

The output signal of the pulse-width modulator PM is applied to the input of the pulse amplifier IV and to the control input of the gated control stage RS. The gain of the pulse amplifier IV is so adjusted by a control signal from the gated control stage RS that the amplitude of the amplifier's output signal V is equal to the maximum amplitude of the output D of the digital-to-analog converter DA.

By means of the electronic changeover switch ES, which is controlled by the clock signal F3 from the clock generator TG, the output signal V of the pulse amplifier IV and the output signal D of the digital-to-analog converter DA are so combined that the output signal D of the digital-to-analog converter DA appears between every two output pulses of the pulse amplifier IV. The resulting combination signal K is shown in FIGS. 2g and 3c. The clock signal F3 is obtained in a simple manner from the clock signal F2 by inversion. During the pulse of the clock signal F3, whose duration is equal to half the period of the clock signal F1, the contact otherwise connecting the output of the pulse amplifier IV to the output of the electronic changeover switch ES is thus connected to the output of the digital-to-analog converter DA.

The combination signal K is applied directly and through the inverter IN to the control inputs of the two halves of the class-D push-pull output stage. The directly controlled half consists of the n-channel VMOS transistors T1, T3, while the other half consists of the p-channel VMOS transistors T2, T4. VMOS transistors, unlike conventional MOS transistors, have a vertical structure and usually a V groove at one surface side of the semiconductor body. The effective channel length of VMOS transistors is determined not by a semiconductor region lying at the surface of the semiconductor body and determined essentially by the shape of the gate electrode but by the diffusion depth of the source region and by a region deep in the semiconductor body.

The VMOS transistors may be replaced by DMOS transistors, the "D" standing for "double diffused".

The series-connected VMOS or DMOS transistors T1, T2 are operated in constant-current mode via the transistors T3, T4, which is achieved by connecting the gate and the drain directly together. The gated control stage RS ensures that the transistors T1, T2 are operated outside their saturation region. It compares the voltage reference U$_r$ with the voltage at the junction point of the drain electrodes of the transistors T1, T2 and controls the amplitude of the combination signal K via the reference voltage of the digital-to-analog converter DA and the voltage controlling the gain of the pulse amplifier IV in such a way that this amplitude always remains so low that the transistors T1, T2 are not driven into saturation.

The aforementioned junction point of the drain electrodes of the transistors T1, T2 is connected to the loudspeaker LS via the low-pass filter TP and the decoupling capacitor C.

While the time scale in FIG. 2 is chosen so that the individual pulses of the clock signal F1 and the pulses derived therefrom can be illustrated, in FIG. 3 the time scale is so compressed that even a change in the output signal D of the digital-to-analog converter DA and its effect can be shown, which is impossible in FIG. 2. There the output signal D is constant over the entire time range shown. In FIGS. 2g and 3c, which both show the combination signal K at the output of the electronic changeover switch ES of FIG. 1, a pulse with the amplitude of the output signal D of the digital-to-analog converter DA can be seen between two of the output pulses of the pulse amplifier IV (FIG. 2e, FIG. 3a).

The invention thus permits the frequency of the clock signal F1 to be considerably lower. If the output signal of the analog-to-digital converter AD is so divided that the number of low-order bits LB is equal to the number of high-order bits HB, the factor of this reduction is $2^{S/2}$, where S is the number of bits of the output signal of the analog-to-digital converter AD. Referred to the example mentioned by way of introduction, i.e., with a resolution of 10 bits, which results in a clock frequency of about 500 MHz, a reduction by a factor of 32 to about 17 MHz is thus obtained.

The audio power amplifier according to the invention can be readily implemented using monolithic integrated circuit techniques, in which case only the class-D push-pull output stage may have to be built with separate transistors. Thus, since the amplifier works essentially on digital principles, the well-known MOS technology is especially suitable for this implementation.

I claim:

1. Audio power amplifier with class-D push-pull output stage, characterized by the following features:

the input stage is an analog-to-digital converter (AD) which provides a binary-coded output signal;

the low-order bits (LB) of the output signal of the analog-to-digital converter (AD) are applied to the input of a digital-to-analog converter (DA), and the other, high-order digits (HB) are applied to the input of a pulse-width modulator (PM);

the output signal (P) of the pulse-width modulator (PM) is applied to a pulse amplifier (IV) whose gain is adjusted by a control signal from a gated control stage (RS) in such a way that the amplitude of the output signal (V) of the pulse amplifier (IV) is equal to the maximum amplitude of the output signal (D) of the digital-to-analog converter (DA);

via an electronic changeover switch (ES), the output signal (D) of the digital-to-analog converter (DA) is added to the output signal (V) of the pulse amplifier (IV) between every two of the output pulses of the pulse amplifier (IV);

this combination signal (K) and the signal inverse thereto each control one of the two halves (T1, T3; T2, T4) of the class-D push-pull output stage, each of which contains a VMOS or DMOS transistor (T1, T2) operated in constant-current mode outside the saturation region, and the control signal for the gain of the pulse amplifier (IV) and the reference voltage of the digital-to-analog converter (DA) are generated by the control stage (RS), which is gated by the output signal of the pulse-width modulator (PM) and compares the drain-source voltages of the series-connected VMOS or DMOS transistors (T1, T2) with a voltage reference (U$_r$) so that these transistors are operated outside their saturation region.

* * * * *